United States Patent
Manickam et al.

(10) Patent No.: US 12,078,697 B1
(45) Date of Patent: Sep. 3, 2024

(54) SYSTEM AND METHOD FOR ADAPTIVE MAGNETIC RESONANCE IMAGING WORKFLOWS FROM PRESCAN DATA FOR SUBJECTS WITH METAL

(71) Applicant: GE Precision Healthcare LLC, Wauwatosa, WI (US)

(72) Inventors: Kavitha Manickam, Pewaukee, WI (US); Dattesh Dayanand Shanbhag, Bengaluru (IN); Dawei Gui, Sussex, WI (US); Chitresh Bhushan, Glenville, NY (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 0 days.

(21) Appl. No.: 18/111,147

(22) Filed: Feb. 17, 2023

(51) Int. Cl.
*G01R 33/28* (2006.01)
*G01R 33/54* (2006.01)

(52) U.S. Cl.
CPC ......... *G01R 33/288* (2013.01); *G01R 33/546* (2013.01)

(58) Field of Classification Search
CPC .. G01R 33/288; G01R 33/546; G01R 33/543; G06T 2207/30052; G06V 2201/03
See application file for complete search history.

(56) References Cited

U.S. PATENT DOCUMENTS

| 11,209,506 | B2 | 12/2021 | Yang et al. |
| 2017/0371010 | A1* | 12/2017 | Shanbhag ............... A61B 5/055 |
| 2018/0172785 | A1* | 6/2018 | Leussler ............... G01R 33/341 |
| 2019/0293737 | A1* | 9/2019 | Eryaman ............... A61B 5/055 |
| 2022/0381860 | A1* | 12/2022 | Biber ............... G01R 33/3815 |

OTHER PUBLICATIONS

Automatic Pre-scan, available Mar. 16, 2018 at https://mriquestions.com/automatic-prescan.html (Year: 2018).*
Metal Artifact Suppression, available Mar. 18, 2018 at https://mriquestions.com/metal-suppression.html (Year: 2018).*
Farkarsh et al., Improving MRI's slice selectivity in the presence of strong, metal-derived inhomogeneities, arXiv:2003.09733, 2020 (Year: 2020).*
Ellenor CW, Stang PP, Etezadi-Amoli M, Pauly JM, Scott GC. Offline impedance measurements for detection and mitigation of dangerous implant interactions: an RF safety prescreen. Magn Reson Med. Mar. 2015;73(3):1328-39 (Year: 2015).*

* cited by examiner

*Primary Examiner* — Daniel R Miller
(74) *Attorney, Agent, or Firm* — Fletcher Yoder P.C.

(57) ABSTRACT

A computer-implemented method for performing a scan of a subject utilizing a magnetic resonance imaging (MRI) system includes initiating, via a processor, a prescan of the subject by an MRI scanner of the MRI system without a priori knowledge as to whether the subject has a metal implant. The computer-implemented method also includes executing, via the processor, a metal detection algorithm during a prescan entry point of the prescan to detect whether the metal implant is present in the subject. The computer-implemented method further includes determining, via the processor, to proceed with a calibration scan and the scan utilizing predetermined scan parameters when no metal implant is detected in the subject. The computer-implemented method even further includes switching, via the processor, into a metal implant scan mode when one or more metal implants are detected in the subject.

12 Claims, 8 Drawing Sheets

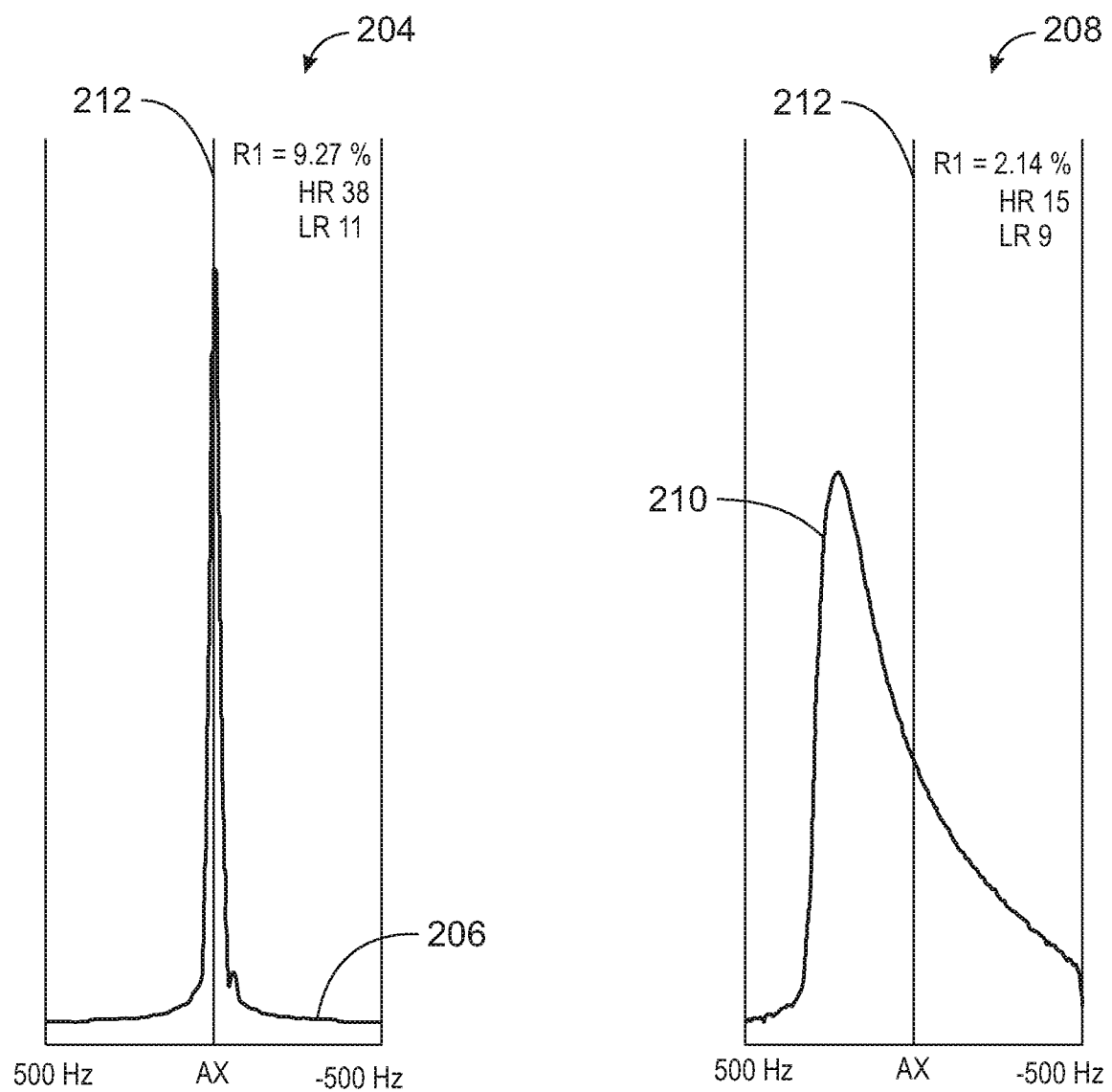

SYSTEM AND METHOD FOR ADAPTIVE MAGNETIC RESONANCE IMAGING WORKFLOWS FROM PRESCAN DATA FOR SUBJECTS WITH METAL

BACKGROUND

The subject matter disclosed herein relates to medical imaging and, more particularly, to a system and method for adaptive magnetic resonance imaging (MRI) workflows from prescan data for subjects with metal.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, Mt. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

As MR becomes more accessible, patients with a wide range of implants (e.g., metal implants) are being scanned. There are scenarios where the patients are unaware of it or the patients are not in a state to provide the information to the technologist. As a result, the presence of metal can only be confirmed after the localizer scan and can result in disruption of the scanning workflow. This can result in unusable images or poor image quality. This can also result in wasted scan time since the imaging pulse has to be modified and the scans repeated.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for performing a scan of a subject utilizing a magnetic resonance imaging (MRI) system is provided. The computer-implemented method includes initiating, via a processor, a prescan of the subject by an MRI scanner of the MRI system without a priori knowledge as to whether the subject has a metal implant. The computer-implemented method also includes executing, via the processor, a metal detection algorithm during a prescan entry point of the prescan to detect whether the metal implant is present in the subject. The computer-implemented method further includes determining, via the processor, to proceed with a calibration scan and the scan utilizing predetermined scan parameters when no metal implant is detected in the subject. The computer-implemented method even further includes switching, via the processor, into a metal implant scan mode when one or more metal implants are detected in the subject.

In another embodiment, a system for performing a scan of a subject utilizing an MRI system is provided. The system includes a memory encoding processor-executable routines. The system also includes a processor configured to access the memory and to execute the processor-executable routines, wherein the processor-executable routines, when executed by the processor, cause the processor to perform actions. The actions include initiating a prescan of the subject by an MRI scanner of the MRI system without a priori knowledge as to whether the subject has a metal implant. The actions also include executing a metal detection algorithm during a prescan entry point of the prescan to detect whether the metal implant is present in the subject. The actions further include determining to proceed with a calibration scan and the scan utilizing predetermined scan parameters when no metal implant is detected in the subject. The actions even further include switching into a metal implant scan mode when one or more metal implants are detected in the subject.

In a further embodiment, a non-transitory computer-readable medium, the computer-readable medium including processor-executable code that when executed by a processor, causes the processor to perform actions. The actions include initiating a prescan of the subject by an MRI scanner of the MRI system without a priori knowledge as to whether the subject has a metal implant. The actions also include executing a metal detection algorithm during a prescan entry point of the prescan to detect whether the metal implant is present in the subject. The actions further include determining to proceed with a calibration scan and a scan utilizing predetermined scan parameters when no metal implant is detected in the subject. The actions even further include switching into a metal implant scan mode when one or more metal implants are detected in the subject.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein:

FIG. 3 illustrates a graph of a center frequency pattern of scan of the targeted radionuclides for a phantom lacking metal;

FIG. 4 illustrates a graph of a center frequency pattern of scan of the targeted radionuclides for a phantom having a metal implant;

DETAILED DESCRIPTION

Figure 1:
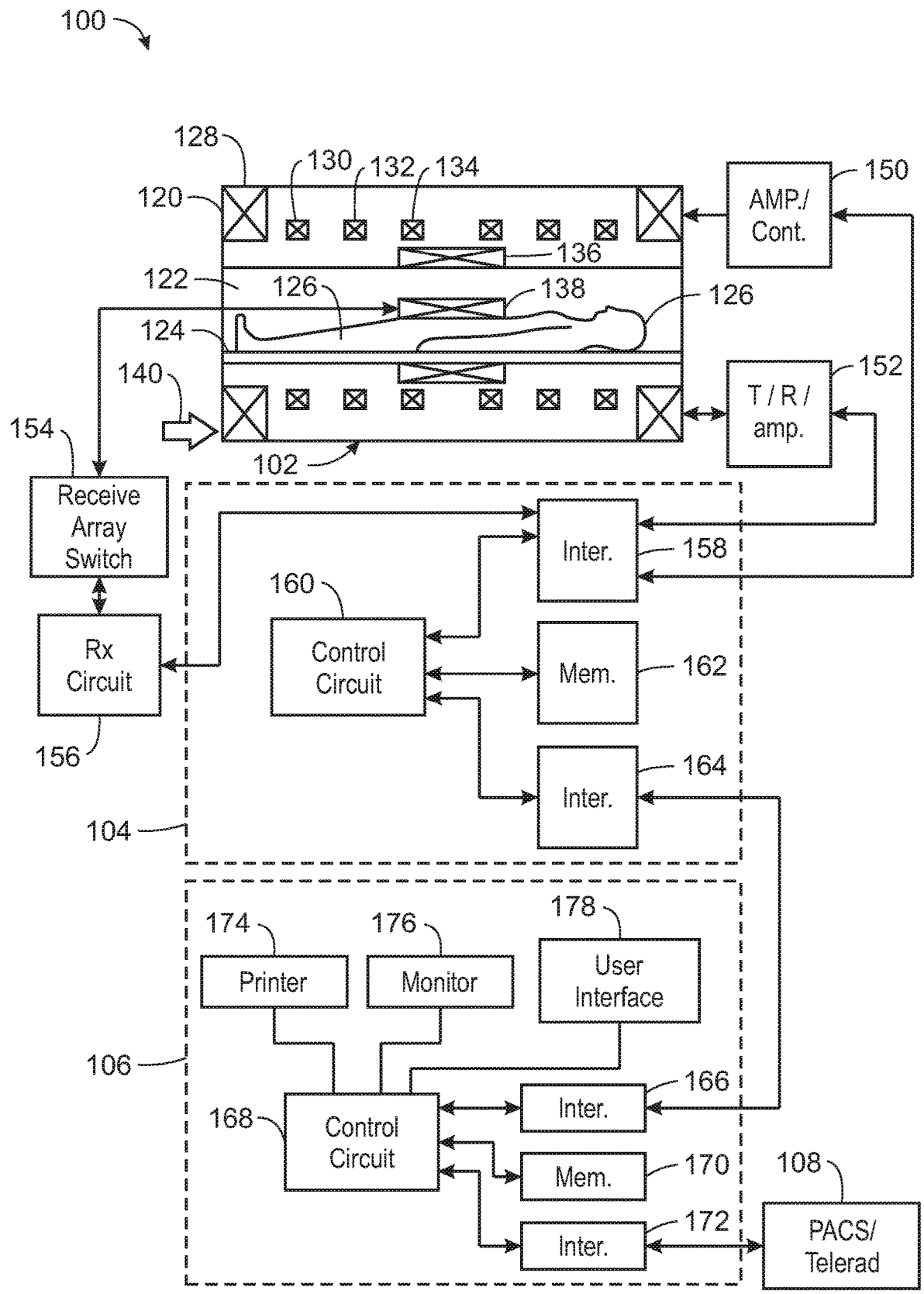
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As used herein, the terms "automatic" and "automatically" refer to actions that are performed by a computing device or computing system (e.g., of one or more computing devices) without human intervention. For example, automatically performed functions may be performed by computing devices or systems based solely on data stored on and/or received by the computing devices or systems despite the fact that no human users have prompted the computing devices or systems to perform such functions. As but one non-limiting example, the computing devices or systems may make decisions and/or initiate other functions based solely on the decisions made by the computing devices or systems, regardless of any other inputs relating to the decisions.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides systems and methods for adaptive magnetic resonance imaging (MRI) workflows from prescan data for subjects with metal. In particular, prescan data of a localizer scan is utilized to detect and localize metal regions (e.g., metal implants) in a subject (e.g., patient). This information can be used to setup the correct imaging pulse sequence and related parameters to take into consideration the metal regions. The parameters could be related to the pulse sequence or adaptive workflow for an intelligent scan plane prescription or shimming. This information can also be utilized in the post-processing for qualitative analysis (e.g., in spectroscopy or T2* mapping). The disclosed embodiments are anatomy agnostic (i.e., can be used on any part of the body). The disclosed embodiments include detecting the presence of metal using a prescan entry point (e.g., center frequency adjustment entry point or autocoil calibration entry point) during a prescan portion (e.g., of a localizer scan prior acquiring localizer images). The disclosed embodiments also include localization of any metal/abnormality (e.g., metal implant) in the subject using calibration-based image data from a calibration scan portion of a localizer scan (e.g., prior to acquiring localizer images). The disclosed embodiments further include switching into a metal implant scan mode when a metal region or metal implant is detected in the subject. In the metal implant scan mode, one of a plurality of different workflows (e.g., metal scanning workflows) are followed that utilize the prescan data and the localization information of the metal implant to automatically choose the correct imaging pulse sequence and its parameters or suggest an appropriate action. In one workflow in the metal implant scan mode, a metal artifact reducing calibration scan is initiated followed by a scan (e.g., rest of localizer scan to acquire localizer images and/or diagnostic scan). In another workflow in the metal implant scan mode, one or more scan parameters (e.g., pulse sequence parameters) and a scan plane prescription for a scan (e.g., (e.g., rest of localizer scan to acquire localizer images and/or diagnostic scan) are adjusted, a correct imaging pulse sequence to account for the one or more metal implants detected in the subject is selected, and then the scan is initiated. In a further workflow in the metal implant scan mode, for certain used cases (e.g., prostate MRI) a notification is provided to an operator of the MRI scanner to utilize a lower field strength MRI scanner (e.g., 1.5 Tesla (T) or lower MRI scanner) for scanning the subject.

The disclosed embodiments provide a faster and automatic way to detect metal within a subject and to trigger metal scanning workflows automatically to reduce the cognitive burden of the technologists. Also, the disclosed embodiments provide for better image quality. Further, the disclosed embodiments provide optimization of imaging scan parameters to scan pathology in the presence of metal. Even further, the disclosed embodiments avoid wasting scan time due to repeated scans.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, image reconstruction may occur on a separate computing device having processing circuitry and memory circuitry.

The memory circuit 170 may store code for detecting the presence of metal using a prescan entry point (e.g., center frequency adjustment entry point or autocoil calibration entry point) during a prescan portion (e.g., of a localizer scan prior acquiring localizer images). The memory circuit 170 may also store code for localization of any metal/abnormality (e.g., metal implant) in the subject using calibration-based image data from a calibration scan portion of a localizer scan (e.g., prior to acquiring localizer images). The memory circuit 170 may further include code for switching into a metal implant scan mode when a metal region or metal implant is detected in the subject. The memory circuit 170 may store code to select and follow one of a plurality of different workflows (e.g., metal scanning workflows) that utilize the prescan data and the localization information of the metal implant to automatically choose the correct imaging pulse sequence and its parameters or suggest an appropriate action. In one workflow in the metal implant scan mode, a metal artifact reducing calibration scan is initiated followed by a scan (e.g., rest of localizer scan to acquire localizer images and/or diagnostic scan). In another workflow in the metal implant scan mode, one or more scan parameters (e.g., pulse sequence parameters) and a scan plane prescription for a scan (e.g., (e.g., rest of localizer scan to acquire localizer images and/or diagnostic scan) are adjusted, a correct imaging pulse sequence to account for the one or more metal implants detected in the subject is selected, and then the scan is initiated. In a further workflow in the metal implant scan mode, for certain used cases (e.g., prostate MRI) a notification is provided to an operator of the MRI scanner to utilize a lower field strength MRI scanner (e.g., 1.5 Tesla (T) or lower MRI scanner) for scanning the subject.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
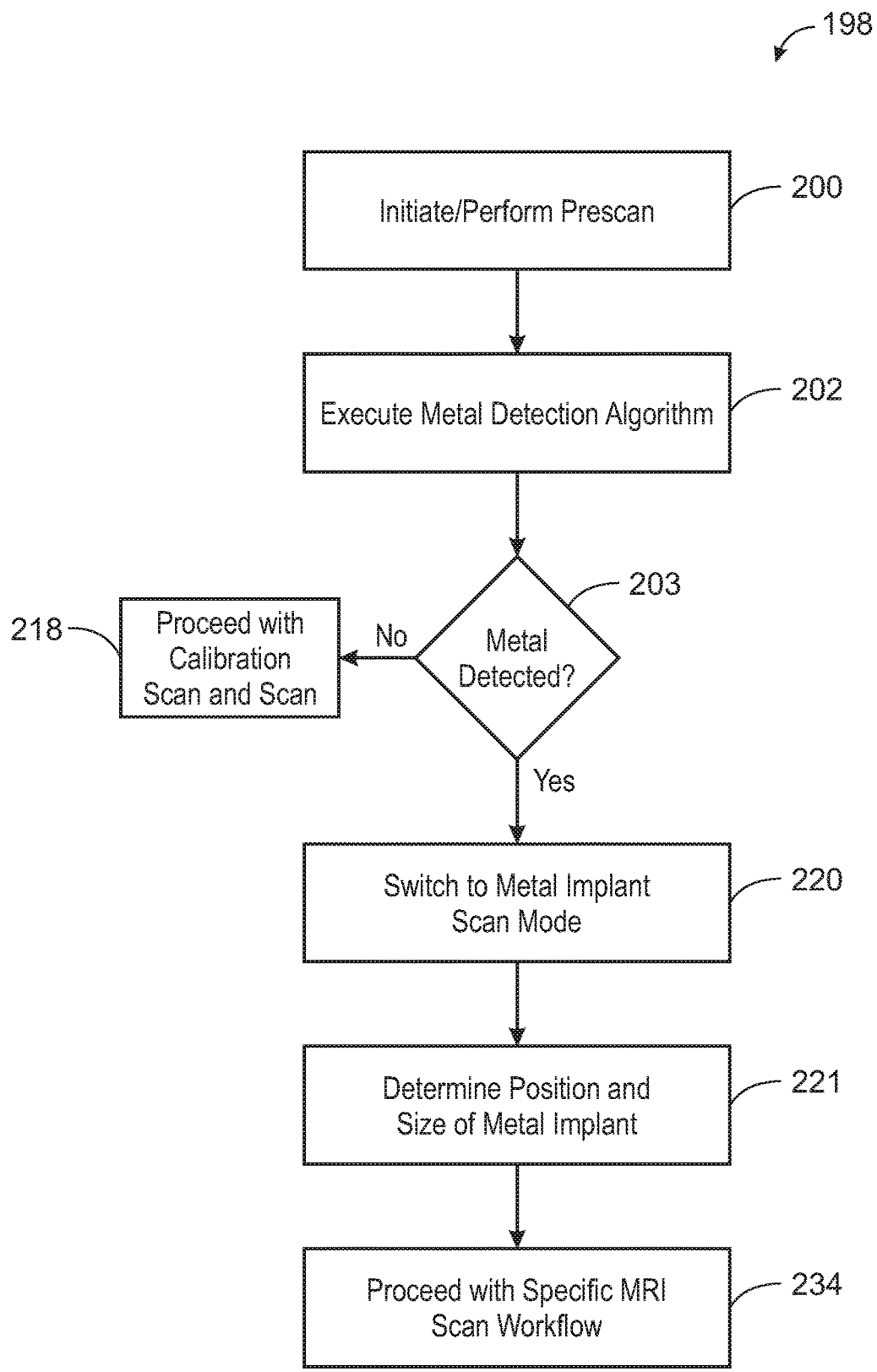
FIG. 2 illustrates a flowchart of a method for performing a scan of a patient utilizing the MRI system in FIG. 1 utilizing an adaptively selected MR scanning workflow, in accordance with aspects of the present disclosure.

FIG. 2 illustrates a flow diagram of a method 198 for performing a scan of a patient utilizing the MRI system 100 in FIG. 1 utilizing an adaptively selected MR scanning workflow. One or more steps of the method 198 may be performed by processing circuitry of the magnetic resonance imaging system 100 in FIG. 1. One or more of the steps of the method 198 may be performed simultaneously or in a different order from the order depicted in FIG. 2.

The method 198 includes initiating or performing a prescan (as part of a localizer scan but prior to acquiring localizer images) of the subject by an MRI scanner (e.g., MRI scanner 102 in FIG. 1) of the MRI system without a priori knowledge as to whether the subject (e.g., patient) has a metal implant (block 200). During the prescan, several calibrations are performed (e.g., to provide tuning values) to ensure optimal performance of specified protocol. A number of steps may occur during the prescan. Some of these steps provide entry points for determining (e.g., utilizing a metal detection algorithm) whether any metal regions (or metal implants) are present in a subject prior to acquiring any localizer images. For example, quick shimming may occur. During quick shimming, small adjustments are made to currents passing through gradients and higher order shim coils to optimize $B_0$ field homogeneity in the presence of the patient. Also, coil tuning and matching may occur. There are differences in the size and the shape of human bodies which crate different loads on the RF coils. Thus, the resonance frequency of the patient coil system needs to be adjusted along with the coil impedance (complex resistance) for effective energy transfer. Further, center frequency adjustment may occur. Human tissues contain both water and fat in various proportions whose resonance peaks differ by a few hundred hertz. The MRI scanner needs to lock on to the correct spectral peak for proper localization. Even further, transmitter attenuation/gain adjustment may occur. The attenuator or amplifier gain of the RF pulse needs to be calibrated for each patient so that the proper flip angle can be obtained. Still further, the receive attenuation/gain adjustment may occur. The MR signal intensity needs to be appropriately scaled so it is neither too big nor too small for the amplifier chain. Yet further, dummy cycles may occur. Dummy cycles are multiple runs of a pulse sequence prior to acquiring data to allow a steady state magnetization to develop.

The method 198 also includes automatically executing a metal detection algorithm during a prescan entry point of the prescan (block 202) to detect whether the metal implant is present in the subject (block 203). In certain embodiments, the metal entry point where the metal detection algorithm is executed is the center frequency adjustment entry point. In certain embodiments, the metal detection algorithm is configured to detect whether the metal region or metal implant is present in the subject based on a center frequency of a RF excitation pulse. FIG. 3 illustrates a graph 204 of a center frequency pattern 206 of an RF excitation pulse for a phantom lacking metal (data quality assurance (DQA) phantom from GE Healthcare). FIG. 4 illustrate a graph 208 of a center frequency pattern 210 of an RF excitation pulse for a phantom having a metal implant. The center frequency patterns 206, 210 were obtained utilizing a 1.5T MRI scanner. As depicted in FIGS. 3 and 4, a peak of the center frequency pattern 210 is not centrally located relative to a central reference point 212 when compared to the peak of the center frequency pattern 206. There is a difference in center frequency between the center frequency patterns 206, 210 is 600 hertz (Hz).

Figure 6:
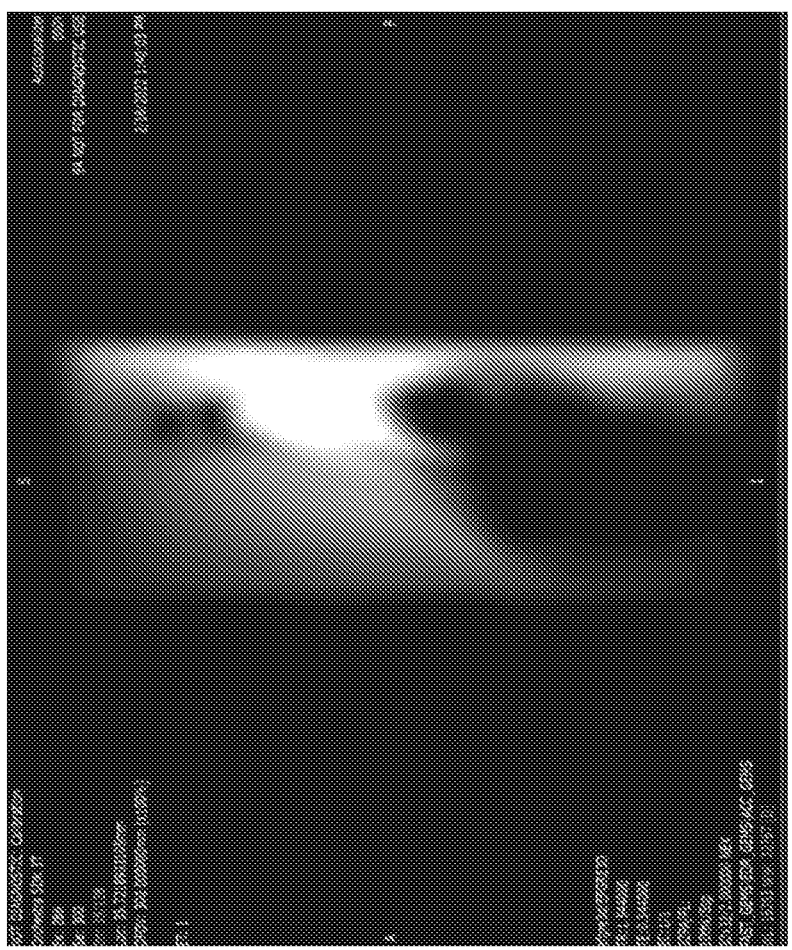
FIG. 6 illustrates an example of a phase image from a Cartesian calibration from an autocoil calibration entry point with a metal implant detected, in accordance with aspects of the present disclosure.
Figure 5:
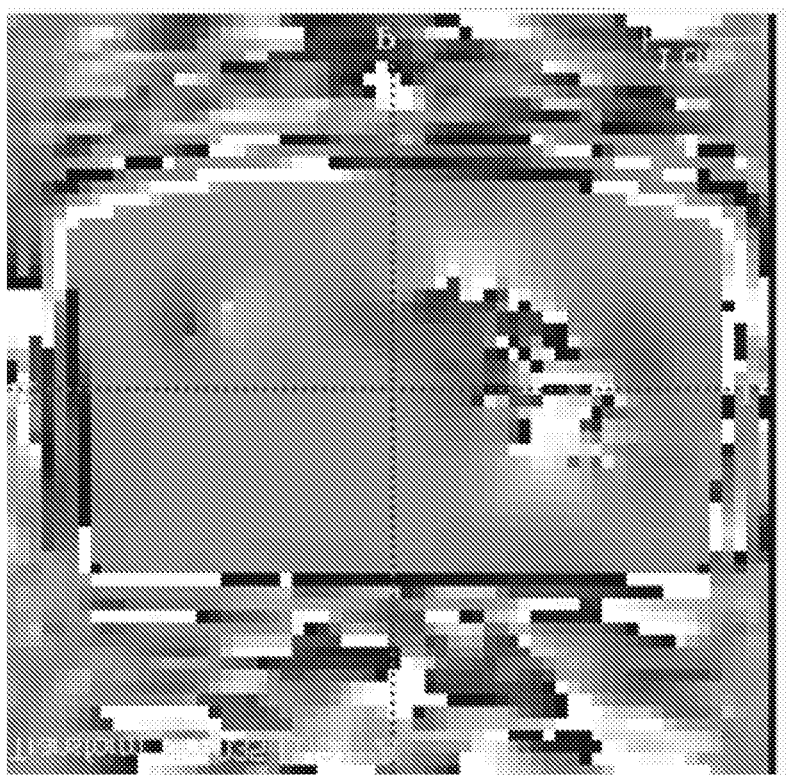
FIG. 5 illustrates an example of a phase image from calibration scan with a metal implant detected, in accordance with aspects of the present disclosure.

In certain embodiments, the metal entry point may be another of the prescan entry points. For example, the metal detection algorithm is configured to detect whether the metal region or metal implant is present in the subject based on phase images from calibration data acquired during the prescan (e.g., as part of the localizer scan but prior to acquisition of localizer images). FIG. 5 illustrates an example of a phase image 214 from an autocoil calibration entry point with a metal implant detected in the phase image 214. FIG. 6 illustrates an example of a phase image 216 from a Cartesian calibration from an autocoil calibration entry point with a metal implant detected in the phase image 216.

Returning to FIG. 2, when no metal region or metal implant is detected in the subject, the method 198 includes automatically determining to proceed with a calibration scan (as part of the localizer scan) and the rest of the localizer scan and the subsequent scan (e.g., diagnostic scan) (block 218). The predetermined scan parameters (i.e., determined prior to the prescan) and predetermined imaging pulse sequence (i.e., also determined prior to the prescan) are utilized for the scan.

When one or more metal regions or metal implants are detected in the subject, the method 198 includes switching into a metal implant scan mode when one or more metal implants are detected in the subject (block 220). In the metal implant scan mode, the method 198 includes determining, via the processor, a respective position and a respective size (e.g., shape and boundary) of the one or more metal implants relative to a scan center during the calibration scan (of the localizer scan prior to acquisition of the localizer images) utilizing the calibration data (block 221). In certain embodiments, the calibration volume from coil selection may be utilized during the characterization of the one or more metal implants. In certain embodiments, a complex image with magnitude and phase (e.g., from array coil spatial sensitivity encoding (ASSET) calibration, phased-array uniformity enhancement (PURE) calibration, or similar calibration scan) may be utilized during characterization of the one or more metal implants. In certain embodiments, a background and a foreground may be determined form calibration magnitude images. The detection and characterization of the one or more metal regions or metal implants may be provided in the digital imaging and communications in medicine (DICOM) tag of any image acquired in the subsequent scan (e.g., diagnostic scan) for use in post-processing.

Figure 7:
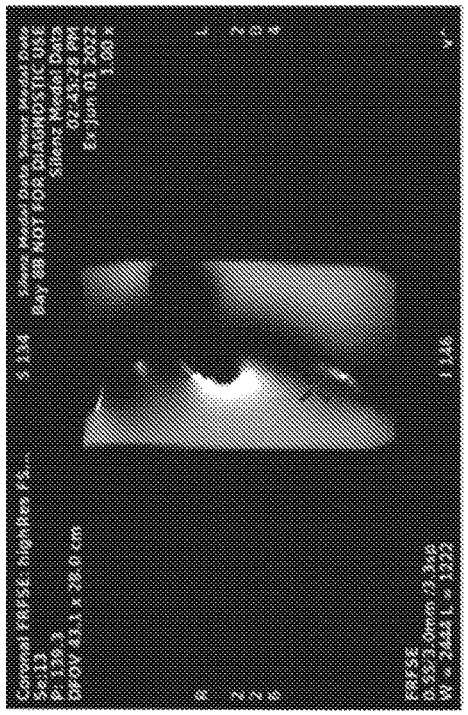
FIGS. 7 and 8 illustrate different high resolution MR images of a phantom having a metal region or metal object.
Figure 8:
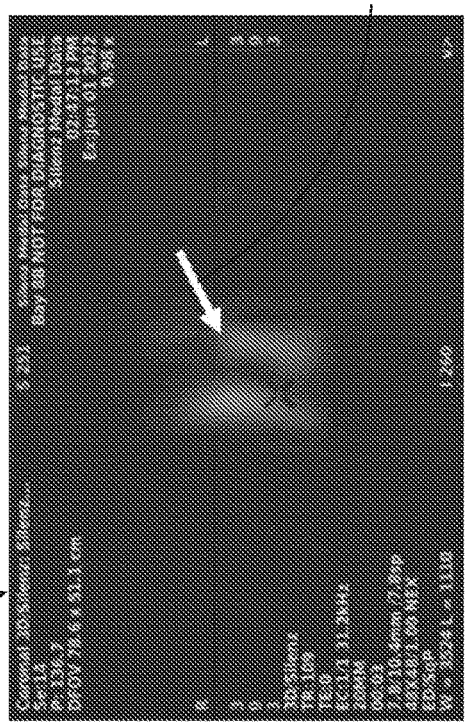
Figure 9:
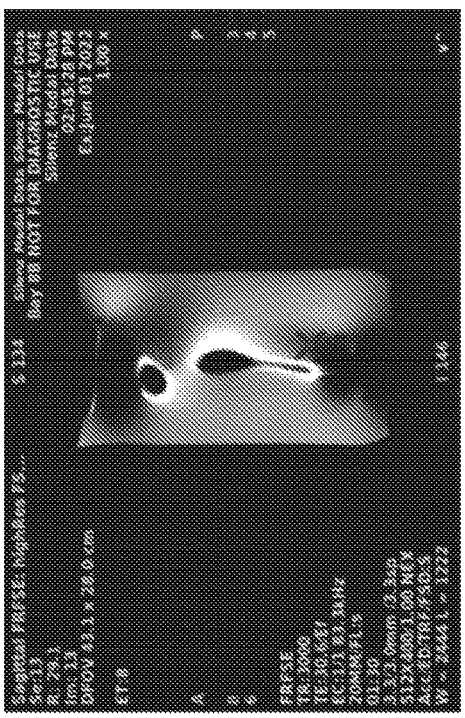
FIG. 9 illustrates a calibration image acquired utilizing Cartesian calibration to delineate a metal region or metal object, in accordance with aspects of the present disclosure.
Figure 10:
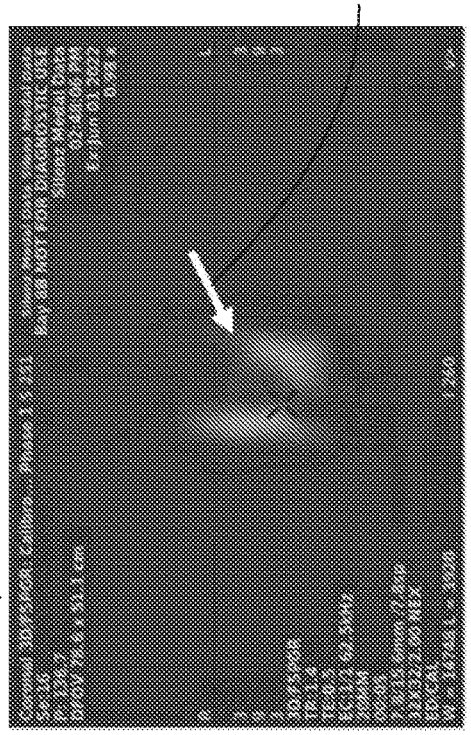
FIG. 10 illustrates a calibration scan image acquired utilizing Zero-echo-time calibration to delineate a metal region or metal object, in accordance with aspects of the present disclosure.

FIGS. 7 and 8 illustrate different high resolution MR images 222, 224 of a phantom having a metal region or metal object. FIGS. 9 and 10 illustrate examples of calibration images derived from calibration data delineating the metal region or metal object in the phantom. FIG. 9 is a calibration image 226 acquired utilizing Cartesian calibration. FIG. 10 is a calibration image 228 acquired utilizing Silenz calibration (TE=0, 3D radial center-out k-space filling and data sampling with relatively small gradient steps). Arrows 230 and 232 point to the metal region or metal object delineated in the images 226 and 228, respectively, to enable the position and size (or shape and boundary) to be determined.

Returning to FIG. 2, when one or more metal regions or metal implants are detected in the subject and subsequent to determining the respective position and the respective size of the one or more metal implants, the method 198 includes proceeding with a specific MRI workflow for the use situation (block 234). In one workflow in the metal implant scan mode (when a metal artifact reducing calibration scan protocol is available), a high resolution metal artifact reducing calibration scan is initiated followed by a scan (e.g., rest of the localizer scan to acquire localizer images and/or a diagnostic scan). In another workflow in the metal implant scan mode (when a metal artifact reducing calibration scan protocol is not available), one or more scan parameters and a scan plane prescription for a scan (e.g., e.g., rest of the localizer scan to acquire localizer images and/or a diagnostic scan) are adjusted, a correct imaging pulse sequence to account for the one or more metal implants detected in the subject is selected, and then the scan is initiated. In a further workflow in the metal implant scan mode, for certain used cases (e.g., prostate MRI) a notification is provided to an operator of the MRI scanner to utilize a lower field strength MRI scanner (e.g., 1.5 Tesla (T) or lower MRI scanner) for scanning the subject.

Figure 11:
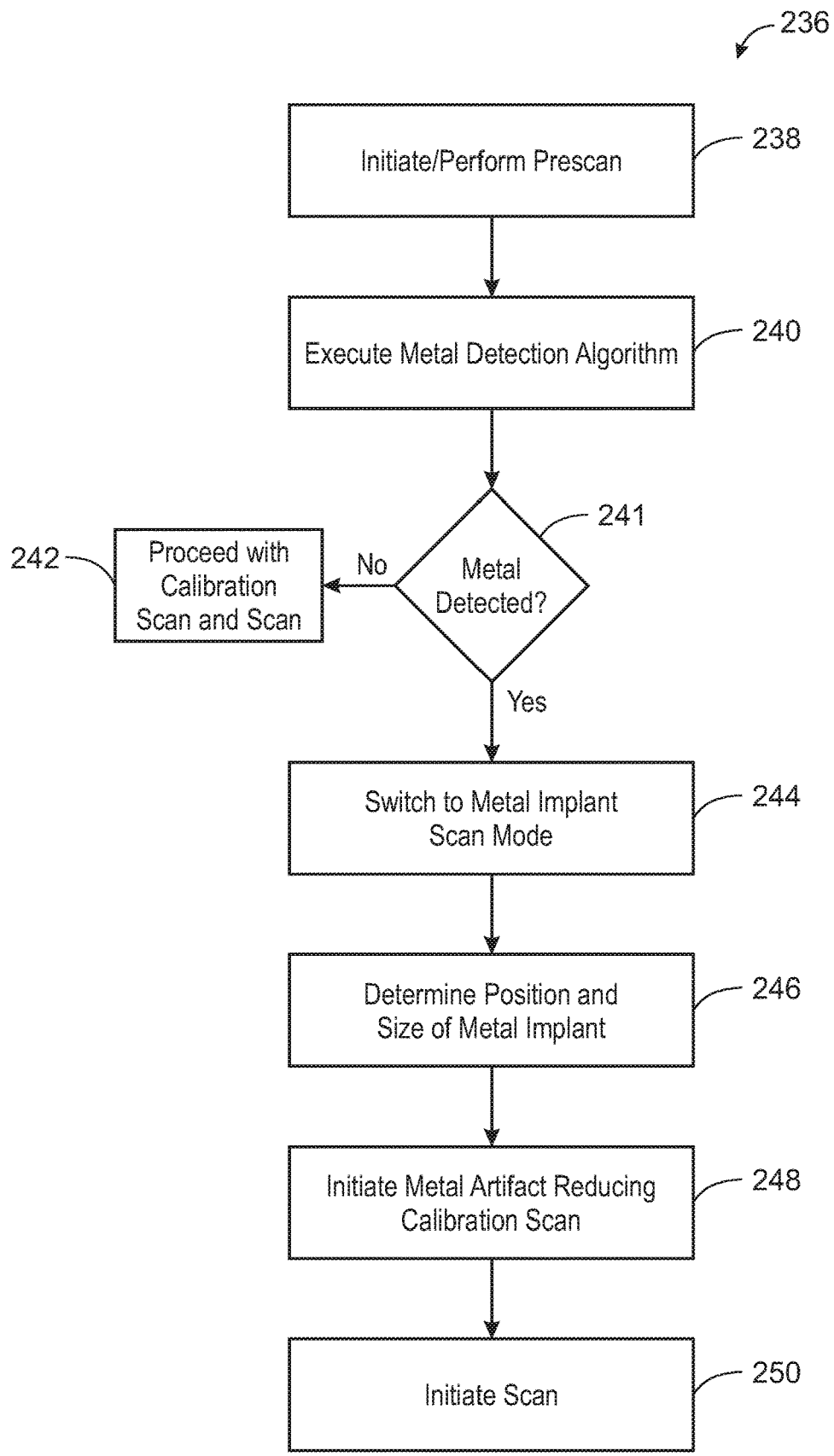
FIG. 11 illustrates a flowchart of a method for performing a scan of a patient utilizing the MRI system in FIG. 1 utilizing an adaptively selected MR scanning workflow (e.g., having a metal artifact reducing calibration), in accordance with aspects of the present disclosure.

FIG. 11 illustrates a flow diagram of a method 236 for performing a scan of a patient utilizing the MRI system 100 in FIG. 1 utilizing an adaptively selected MR scanning workflow (e.g., having a metal artifact reducing calibration). One or more steps of the method 236 may be performed by processing circuitry of the magnetic resonance imaging system 100 in FIG. 1. One or more of the steps of the method 236 may be performed simultaneously or in a different order from the order depicted in FIG. 11.

The method 236 includes initiating or performing a prescan (as part of a localizer scan but prior to acquiring localizer images) of the subject by an MRI scanner (e.g., MRI scanner 102 in FIG. 1) of the MRI system without a priori knowledge as to whether the subject (e.g., patient) has a metal implant (block 238). During the prescan, several calibrations are performed (e.g., to provide tuning values) to ensure optimal performance of specified protocol. A number of steps may occur during the prescan. Some of these steps provide entry points for determining (e.g., utilizing a metal detection algorithm) whether any metal regions (or metal implants) are present in a subject prior to acquiring any localizer images.

The method 236 also includes automatically executing a metal detection algorithm during a prescan entry point of the prescan (block 240) to detect whether the metal implant is present in the subject (block 241). In certain embodiments, the metal entry point where the metal detection algorithm is executed is the center frequency adjustment entry point. In certain embodiments, the metal detection algorithm is configured to detect whether the metal region or metal implant is present in the subject based on a center frequency of a RF excitation pulse. In certain embodiments, the metal entry point may be another of the prescan entry points. For example, the metal detection algorithm is configured to detect whether the metal region or metal implant is present in the subject based on phase images from calibration data acquired during the prescan (e.g., as part of the localizer scan but prior to acquisition of localizer images).

When no metal region or metal implant is detected in the subject, the method 236 includes automatically determining to proceed with a calibration scan (as part of the localizer scan) and the rest of the localizer scan and the subsequent scan (e.g., diagnostic scan) (block 242). The predetermined scan parameters (i.e., determined prior to the prescan) and predetermined imaging pulse sequence (i.e., also determined prior to the prescan) are utilized for the scan.

When one or more metal regions or metal implants are detected in the subject, the method 236 includes automatically switching into a metal implant scan mode when one or more metal implants are detected in the subject (block 244). In the metal implant scan mode, the method 236 includes determining, via the processor, a respective position and a respective size (e.g., shape and boundary) of the one or more metal implants relative to a scan center during the calibration scan (of the localizer scan prior to acquisition of the localizer images) utilizing the calibration data (block 246). The detection and characterization of the one or more metal regions or metal implants may be provided in the DICOM tag of any image acquired in the subsequent scan (e.g., diagnostic scan) for use in post-processing.

When one or more metal regions or metal implants are detected in the subject and subsequent to determining the respective position and the respective size of the one or more metal implants, the method 236 includes automatically initiating a high resolution metal artifact reducing calibration scan (e.g., HyperMavric spectral calibration from GE Healthcare) (block 248). After the high resolution metal artifact reducing calibration scan, the method 236 includes automatically initiating a scan (e.g., rest of the localizer scan to acquire localizer images and/or a diagnostic scan) (block 250).

Figure 12:
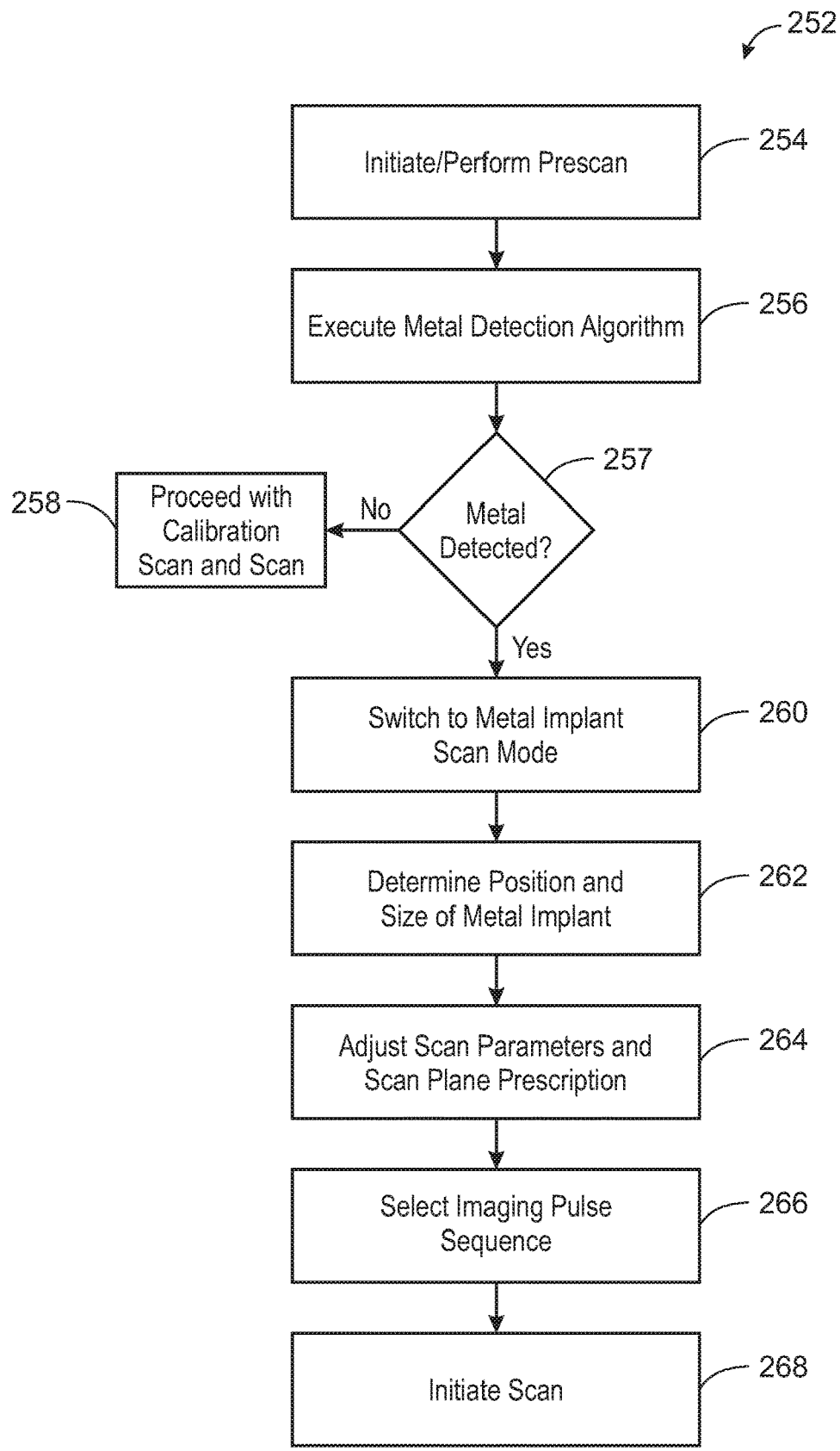
FIG. 12 illustrates a flowchart of a method for performing a scan of a patient utilizing the MRI system in FIG. 1 utilizing an adaptively selected MR scanning workflow (e.g., having scan parameters altered), in accordance with aspects of the present disclosure

FIG. 12 illustrates a flow diagram of a method 252 for performing a scan of a patient utilizing the MRI system 100 in FIG. 1 utilizing an adaptively selected MR scanning workflow (e.g., having scan parameters altered). One or more steps of the method 252 may be performed by processing circuitry of the magnetic resonance imaging system 100 in FIG. 1. One or more of the steps of the method 252 may be performed simultaneously or in a different order from the order depicted in FIG. 12.

The method 252 includes initiating or performing a prescan (as part of a localizer scan but prior to acquiring localizer images) of the subject by an MRI scanner (e.g., MRI scanner 102 in FIG. 1) of the MRI system without a priori knowledge as to whether the subject (e.g., patient) has a metal implant (block 254). During the prescan, several calibrations are performed (e.g., to provide tuning values) to ensure optimal performance of specified protocol. A number of steps may occur during the prescan. Some of these steps provide entry points for determining (e.g., utilizing a metal detection algorithm) whether any metal regions (or metal implants) are present in a subject prior to acquiring any localizer images.

The method 252 also includes automatically executing a metal detection algorithm during a prescan entry point of the prescan (block 256) to detect whether the metal implant is present in the subject (block 257). In certain embodiments, the metal entry point where the metal detection algorithm is executed is the center frequency adjustment entry point. In certain embodiments, the metal detection algorithm is configured to detect whether the metal region or metal implant is present in the subject based on a center frequency of a RF excitation pulse. In certain embodiments, the metal entry point may be another of the prescan entry points. For example, the metal detection algorithm is configured to detect whether the metal region or metal implant is present in the subject based on phase images from calibration data acquired during the prescan (e.g., as part of the localizer scan but prior to acquisition of localizer images).

When no metal region or metal implant is detected in the subject, the method 252 includes automatically determining to proceed with a calibration scan (as part of the localizer scan) and the rest of the localizer scan and the subsequent scan (e.g., diagnostic scan) (block 258). The predetermined scan parameters (i.e., determined prior to the prescan) and predetermined imaging pulse sequence (i.e., also determined prior to the prescan) are utilized for the scan.

When one or more metal regions or metal implants are detected in the subject, the method 252 includes automatically switching into a metal implant scan mode when one or more metal implants are detected in the subject (block 260). In the metal implant scan mode, the method 252 includes determining, via the processor, a respective position and a respective size (e.g., shape and boundary) of the one or more metal implants relative to a scan center during the calibration scan (of the localizer scan prior to acquisition of the localizer images) utilizing the calibration data (block 262). The detection and characterization of the one or more metal regions or metal implants may be provided in the DICOM tag of any image acquired in the subsequent scan (e.g., diagnostic scan) for use in post-processing.

When one or more metal regions or metal implants are detected in the subject and subsequent to determining the respective position and the respective size of the one or more metal implants, the method 252 includes automatically adjusting one or more scan parameters and a scan plane prescription for a scan (e.g., rest of the localizer scan to acquire localizer images and/or a diagnostic scan) (block 264). After adjusting the one or more scan parameters and a scan plane prescription, the method 252 includes automatically selecting a correct imaging pulse sequence to account for the one or more metal implants detected in the subject (block 266). After selecting the correct imaging pulse sequence, the method 252 includes automatically initiating a scan (e.g., rest of the localizer scan to acquire localizer images and/or a diagnostic scan) utilizing the adjusted scan parameters and scan plane prescription and the selected imaging pulse sequence (block 268).

Figure 13:
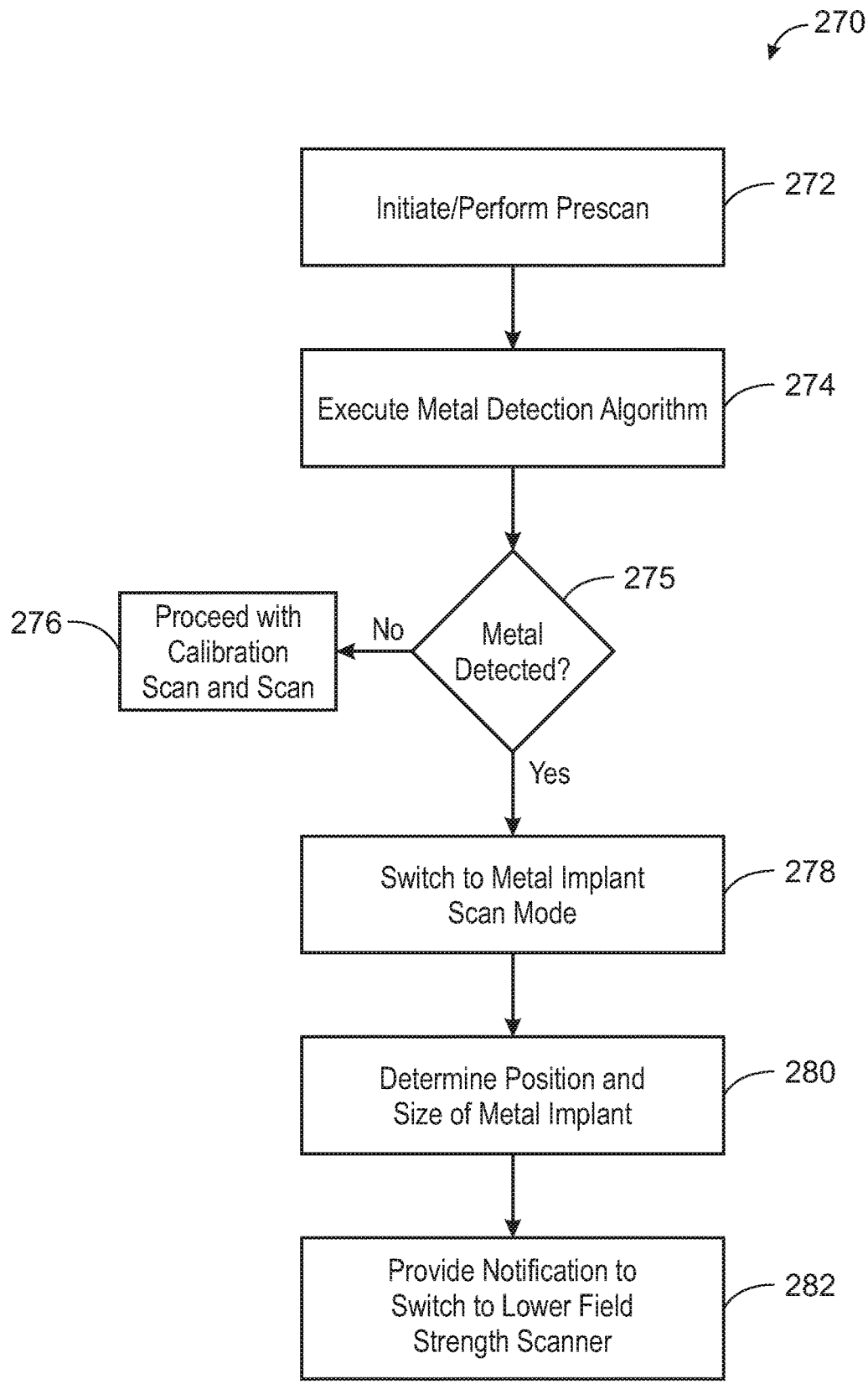
FIG. 13 illustrates a flowchart of a method for performing a scan of a patient utilizing the MRI system in FIG. 1 utilizing an adaptively selected MR scanning workflow (e.g., providing notification to change MRI scanner), in accordance with aspects of the present disclosure.

FIG. 13 illustrates a flow diagram of a method 270 for performing a scan of a patient utilizing the MRI system 100 in FIG. 1 utilizing an adaptively selected MR scanning workflow (e.g., providing notification to change MRI scanner). One or more steps of the method 270 may be performed by processing circuitry of the magnetic resonance imaging system 100 in FIG. 1. One or more of the steps of the method 270 may be performed simultaneously or in a different order from the order depicted in FIG. 13.

The method 270 includes initiating or performing a prescan (as part of a localizer scan but prior to acquiring localizer images) of the subject by an MRI scanner (e.g., MRI scanner 102 in FIG. 1) of the MRI system without a priori knowledge as to whether the subject (e.g., patient) has a metal implant (block 272). During the prescan, several calibrations are performed (e.g., to provide tuning values) to ensure optimal performance of specified protocol. A number of steps may occur during the prescan. Some of these steps provide entry points for determining (e.g., utilizing a metal detection algorithm) whether any metal regions (or metal implants) are present in a subject prior to acquiring any localizer images.

The method 270 also includes automatically executing a metal detection algorithm during a prescan entry point of the prescan (block 274) to detect whether the metal implant is present in the subject (block 275). In certain embodiments, the metal entry point where the metal detection algorithm is executed is the center frequency adjustment entry point. In certain embodiments, the metal detection algorithm is configured to detect whether the metal region or metal implant is present in the subject based on a center frequency of a RF excitation pulse. In certain embodiments, the metal entry point may be another of the prescan entry points. For example, the metal detection algorithm is configured to detect whether the metal region or metal implant is present in the subject based on phase images from calibration data acquired during the prescan (e.g., as part of the localizer scan but prior to acquisition of localizer images).

When no metal region or metal implant is detected in the subject, the method 270 includes automatically determining to proceed with a calibration scan (as part of the localizer scan) and the rest of the localizer scan and the subsequent scan (e.g., diagnostic scan) (block 276). The predetermined scan parameters (i.e., determined prior to the prescan) and predetermined imaging pulse sequence (i.e., also determined prior to the prescan) are utilized for the scan.

When one or more metal regions or metal implants are detected in the subject, the method 270 includes automatically switching into a metal implant scan mode when one or more metal implants are detected in the subject (block 278). In the metal implant scan mode, the method 270 includes determining, via the processor, a respective position and a respective size (e.g., shape and boundary) of the one or more metal implants relative to a scan center during the calibration scan (of the localizer scan prior to acquisition of the localizer images) utilizing the calibration data (block 280). The detection and characterization of the one or more metal regions or metal implants may be provided in the DICOM tag of any image acquired in the subsequent scan (e.g., diagnostic scan) for use in post-processing.

When one or more metal regions or metal implants are detected in the subject and subsequent to determining the respective position and the respective size of the one or more metal implants, the method 270 includes, for certain used cases (e.g., prostate MRI) automatically providing a notification to an operator of the MRI scanner to utilize a lower field strength MRI scanner (e.g., 1.5 Tesla (T) or lower MRI scanner) for scanning the subject (block 282).

Technical effects of the disclosed subject matter include providing for adaptive magnetic resonance imaging (MRI) workflows from prescan data for subjects with metal. In particular, prescan data of a localizer scan is utilized to detect and localize metal regions (e.g., metal implants) in a subject (e.g., patient). This information can be used to setup the correct imaging pulse sequence and related parameters to take into consideration the metal regions. Technical effects also include providing a faster and automatic way to detect metal within a subject and to trigger metal scanning workflows automatically to reduce the cognitive burden of the technologists. Technical effects further include providing for better image quality. Technical effects still further include providing optimization of imaging scan parameters to scan pathology in the presence of metal. Technical effects even further include avoiding wasting scan time due to repeated scans.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for performing a scan of a subject utilizing a magnetic resonance imaging (MRI) system, comprising:
   initiating, via a processor, a prescan of the subject by an MRI scanner of the MRI system without a priori knowledge as to whether the subject has a metal implant;
   executing, via the processor, a metal detection algorithm during a prescan entry point of the prescan to detect whether the metal implant is present in the subject;
   determining, via the processor, to proceed with a calibration scan and the scan utilizing predetermined scan parameters when no metal implant is detected in the subject; and
   switching, via the processor, into a metal implant scan mode when one or more metal implants are detected in the subject, wherein the prescan entry point comprises a center frequency adjustment entry point, and wherein the metal detection algorithm is configured to detect whether the metal implant is present in the subject based on a center frequency scan of targeted radionuclides.

2. The computer-implemented method of claim 1, further comprising, when in the metal implant scan mode, determining, via the processor, a respective position and a respective size of the one or more metal implants relative to a scan center during the calibration scan.

3. The computer-implemented method of claim 2, further comprising, when in the metal implant scan mode and subsequent to determining the respective position and the respective size of the one or more metal implants, initiating, via the processor, a metal artifact reducing calibration scan and then initiating, via the processor, the scan.

4. The computer-implemented method of claim 2, further comprising, when in the metal implant scan mode and subsequent to determining the respective position and the respective size of the one or more metal implants, adjusting, via the processor, one or more scan parameters and a scan plane prescription for the scan and/or selecting, the processor, a correct imaging pulse sequence to account for the one or more metal implants detected in the subject and then initiating, via the processor, the scan.

5. The computer-implemented method of claim 2, further comprising, when in the metal implant scan mode and subsequent to determining the respective position and the respective size of the one or more metal implants, providing, via the processor, a notification to an operator of the MRI scanner to utilize a lower field strength MRI scanner for scanning the subject.

6. A system for performing a scan of a subject utilizing a magnetic resonance imaging (MRI) system, comprising:
   a memory encoding processor-executable routines; and
   a processor configured to access the memory and to execute the processor-executable routines, wherein the processor-executable routines, when executed by the processor, cause the processor to:
      initiate a prescan of the subject by an MRI scanner of the MRI system without a priori knowledge as to whether the subject has a metal implant;
      execute a metal detection algorithm during a prescan entry point of the prescan to detect whether the metal implant is present in the subject;
      determine to proceed with a calibration scan and the scan utilizing predetermined scan parameters when no metal implant is detected in the subject; and
      switch into a metal implant scan mode when one or more metal implants are detected in the subject, wherein the prescan entry point comprises a center frequency adjustment entry point, and wherein the metal detection algorithm is configured to detect whether the metal implant is present in the subject based on a center frequency scan of targeted radionuclides.

7. The system of claim 6, wherein the processor-executable routines, when executed by the processor, cause the processor to, when in the metal implant scan mode, determine a respective position and a respective size of the one or more metal implants relative to a scan center during the calibration scan.

8. The system of claim 7, wherein the processor-executable routines, when executed by the processor, cause the processor to, when in the metal implant scan mode and subsequent to determine the respective position and the respective size of the one or more metal implants, initiating a metal artifact reducing calibration scan and then initiate the scan.

9. The system of claim 7, wherein the processor-executable routines, when executed by the processor, cause the processor to, when in the metal implant scan mode and subsequent to determining the respective position and the respective size of the one or more metal implants, adjust one or more scan parameters and a scan plane prescription for the scan and/or select a correct imaging pulse sequence to account for the one or more metal implants detected in the subject and then initiate the scan.

10. The system of claim 7, wherein the processor-executable routines, when executed by the processor, cause the processor to, when in the metal implant scan mode and subsequent to determining the respective position and the respective size of the one or more metal implants, provide a notification to an operator of the MRI scanner to utilize a lower field strength MRI scanner for scanning the subject.

11. A non-transitory computer-readable medium, the computer-readable medium comprising processor-executable code that when executed by a processor, causes the processor to:

initiate a prescan of a subject by a magnetic resonance imaging (MRI) scanner of an MRI system without a priori knowledge as to whether the subject has a metal implant;

execute a metal detection algorithm during a prescan entry point of the prescan to detect whether the metal implant is present in the subject;

determine to proceed with a calibration scan and a scan utilizing predetermined scan parameters when no metal implant is detected in the subject; and switch into a metal implant scan mode when one or more metal implants are detected in the subject, wherein the prescan entry point comprises a center frequency adjustment entry point, and wherein the metal detection algorithm is configured to detect whether the metal implant is present in the subject based on a center frequency scan of targeted radionuclides.

12. The non-transitory computer-readable medium of claim 11, wherein the processor-executable code, when executed by the processor, cause the processor to, when in the metal implant scan mode, determine a respective position and a respective size of the one or more metal implants relative to a scan center during the calibration scan.

* * * * *